United States Patent [19]

Kikuchi et al.

[11] 4,412,240

[45] Oct. 25, 1983

[54] SEMICONDUCTOR INTEGRATED CIRCUIT AND WIRING METHOD

[75] Inventors: Hideo Kikuchi; Shigenori Baba, both of Yokohama; Shoji Sato, Sagamihara, all of Japan

[73] Assignee: Fujitsu Limited, Kawasaki, Japan

[21] Appl. No.: 198,131

[22] PCT Filed: Feb. 22, 1980

[86] PCT No.: PCT/JP80/00025

§ 371 Date: Oct. 27, 1980

§ 102(e) Date: Oct. 15, 1980

[87] PCT Pub. No.: WO80/01859

PCT Pub. Date: Sep. 4, 1980

[30] Foreign Application Priority Data

Feb. 27, 1979 [JP] Japan .................................. 54-22289

[51] Int. Cl.³ ............................................. H01L 27/00
[52] U.S. Cl. .......................................... 357/45; 357/68
[58] Field of Search ...................................... 357/45, 68

[56] References Cited

U.S. PATENT DOCUMENTS 4,278,897 7/1981 Ohno et al. .......................... 357/45
4,295,149 10/1981 Balyoz et al. ....................... 357/45

Primary Examiner—James W. Davie
Attorney, Agent, or Firm—Staas & Halsey

[57] ABSTRACT

A large scale semiconductor integrated circuit and its wiring method employing a grid system where the layout space is partitioned in the form of a grid by vertical and horizontal line group having an interval larger than a length corresponding to a minimum dimension for a patterning in a manufacturing process; wiring patterns for making connection between each cell which is a unit of layout are depicted on such vertical and horizontal lines; and wirings are made on the basis of the wiring patterns. An interval (d) of these vertical and horizontal lines of the grid is the greatest common factor of the minimum wiring pitches of several overlapped wiring layers and is selected to a dimension which is smaller than said wiring pitch; and the vertical and horizontal line patterns are depicted on the vertical and horizontal lines having the same interval. The vertical and horizontal dimensions of the cell are an integer multiple of the interval (d) of the grid and cell terminals are disposed in an allowable wiring locations on the grid.

13 Claims, 6 Drawing Figures

SEMICONDUCTOR INTEGRATED CIRCUIT AND WIRING METHOD

DESCRIPTION

1. Technical Field

The present invention relates to a semiconductor integrated circuit, and more particularly to a large scale integrated circuit and wiring method suited to automatic designing.

2. Background Art

As is well known, the density of an integrated circuit (IC) structure is increasing and resultingly layout of an IC can be made in a unit of a circuit (called a "cell") such as a NAND gate or flip-flop instead of a transistor, and wiring is carried out by the grid system where connection between cells can be established. Thereby, the amount of information considered at the time of designing can be reduced and the processing rate can also be improved. In this grid wiring system, the layout space is partitioned in the form of a grid with the dimensions larger than the minimum dimension for patterning the wiring material layer in fabrication of ICs, for example, by the vertical and horizontal lines having the interval of the wiring pitch dimensions (in actuality that interval multiplied by the reduction scale), and the wiring pattern is depicted on such vertical and horizontal lines. The wiring pitch differs in accordance with the wiring layer location such as 1st or 2nd layers and the wiring material such as aluminium, polysilicon or diffusion layer. For example, in the case of 1st layer wiring of aluminium, the allowable minimum line interval is 10 $\mu$m; or in the case of polysilicon it is 10 $\mu$m, while that of the 2nd layer of aluminium is 15 $\mu$m. Here, the existing grid employs the rectangular mesh having a horizontal line interval of 10 $\mu$m and vertical line interval of 15 $\mu$m. Use of this grid allows drawing of the wiring pattern of the 1st layer (with the allowable minimum line interval) correctly only by depicting the lines indicating the wiring on the horizontal lines, and also allows drawing of the wiring pattern of the 2nd layer correctly only by depicting the lines indicating the wiring on the vertical lines. Thus, a mask can be generated on the basis of this grid and wiring of the IC can be obtained through the photo process, etc.

Before employing the grid system for designing the semiconductor device, usually the section paper forming a square mesh with equal horizontal and vertical line intervals has been used in order to depict the wiring pattern. Namely, the lines indicating wirings were are drawn on the horizontal or vertical lines of this section paper or between the horizontal and vertical lines. Then, such drawing is reduced, for example, to the scale of 1/1000 (when the mesh has an interval of 1 mm, it is reduced up to 1 $\mu$m or 0.5 $\mu$m which almost corresponds to the minimum dimensions of the patterning) in order to obtain the mask. In this method using such section paper, it is required to check if the interval between wiring patterns depicted is larger than the allowable minimum line interval or not, and this check is very troublesome when an IC has succeeded in achieving greater density.

Considering this point, the grid system is very convenient and the wiring interval always becomes broader than the allowable minimum line interval when a rule that the wiring should always be depicted on the grid (vertical, horizontal lines) is observed. Therefore, the line interval check is not required in the grid system.

However, in the existing grid system, for example, the horizontal line is used for the 1st layer individually, while the vertical line is used for the 2nd layer (thereby the allowable minimum line interval of each layer can be reserved easily). In case where the cells 1 and 2 exist as shown in FIG. 1 and wiring is established between these cells and thereby the wirings 3, 4, 5 must be bent at the portions a and b, the 1st layer wiring should be connected to the 2nd layer wiring at the portion a, while the 2nd wiring should be connected to the 1st layer wiring again at the portion b. Thus the 1st layer and 2nd layer wirings are connected at the points a and b via through holes. This wiring method is very complicated, requiring wider wiring areas and reducing the yield. It is also possible to form the wirings which are bent in the X and Y directions like the wirings 3, 4 and 5 on the same layer even in the existing grid system, but in this case, integration density is always reduced. Namely, when it is attempted to form the wirings 3, 4, and 5 as the 1st wiring layer, the vertical lines have the allowable minimum line interval of the 2nd layer which is larger than that of the 1st layer and the line interval is wider than necessary. When it is attempted to form the wirings 3, 4, and 5 as the 2nd wiring layer, the horizontal lines must be depicted in every other line because if it is depicted on the adjacent horizontal line, the line interval becomes insufficient. However, in this case, such line interval becomes 10 $\mu$m $\times$ 2 which is larger than the 15 $\mu$m required. Thus, in any case, line interval becomes large in the vertical or horizontal line portions of wiring, resulting in reduction of integration density.

When the cell system is employed, the size of a cell is selected to be an integer times the grid interval, and when the cell is disposed within a chip the input and output terminals are usually arranged on the vertical and horizontal lines of the grid. In the case where such a cell system is employed to said existing grid, since the intervals of vertical and horizontal lines differ, if a cell orientation is rotated by 90 degrees (rotation in 90 degrees often occurs due to the convenience of connections, etc.), a problem that the terminals of the cell do not match the arrangement of vertical and horizontal lines will occur. Such a problem suppresses the degree of freedom of layout and also restricts improvement in integration density.

In the existing section paper system, since the mesh is square, the line interval will not exceed the necessary interval even if the wirings bending to the X and Y directions (like the wirings 3, 4 and 5) are formed as the same wiring layer. Moreover, the cell can be rotated easily for 90 degrees, without generating a problem that the cell terminals do not match the vertical and horizontal lines. But, as mentioned previously, this system has a very troublesome problem that all line intervals of the wiring patterns depicted must be checked, and in addition, processing for layout is complicated due to a large degree of freedom in the layout and it is very difficult to realize an automatic layout of the wiring pattern.

SUMMARY OF THE INVENTION

This invention discloses a semiconductor integrated circuit and its wiring method, which has eliminated the disadvantages of the existing methods yet maintained the advantages of them.

It is an object of this invention to offer a wiring method which can set the wiring interval to the allowable minimum value by a check with no trouble and allows bending of wiring in the same layer in the X and Y directions without deteriorating the integration density.

It is another object of this invention to offer a semiconductor integrated circuit which is suited to the wiring thus established by the above-mentioned wiring method and has cells with a large degree of freedom of layout in the circuit.

These objects of the present invention can be attained in the wiring method of the grid system where the layout space is partitioned into the form of a grid by the vertical and horizontal line groups having intervals larger than the length corresponding to the minimum dimenison for patterning in the manufacturing process. The wiring patterns for connection between each cell which is a unit of layout are depicted on such vertical and horizontal lines, and wiring of the integrated circuit is carried out on the basis of said wiring patterns through the following processes:

an interval of said vertical and horizontal lines of the grid is selected to a dimension of the greatest common factor of the minimum wiring pitches which can be expressed by the maximum unit indicated by an integer of overlapped plural wiring layers which is not a prime number;

the patterns of vertical and horizontal wiring which are disposed on the same layer or disposed separately on different layers are depicted on the vertical and horizontal lines having the same interval;

the vertical and horizontal dimensions of the cell of integrated circuits which are formed by the abovementioned wiring method are set to the integer multiple of said interval; and the terminals of said cell are arranged in the allowed wiring locations of said vertical and horizontal lines.

DESCRIPTION OF THE PREFERRED EMBODIMENT

Figure 1:
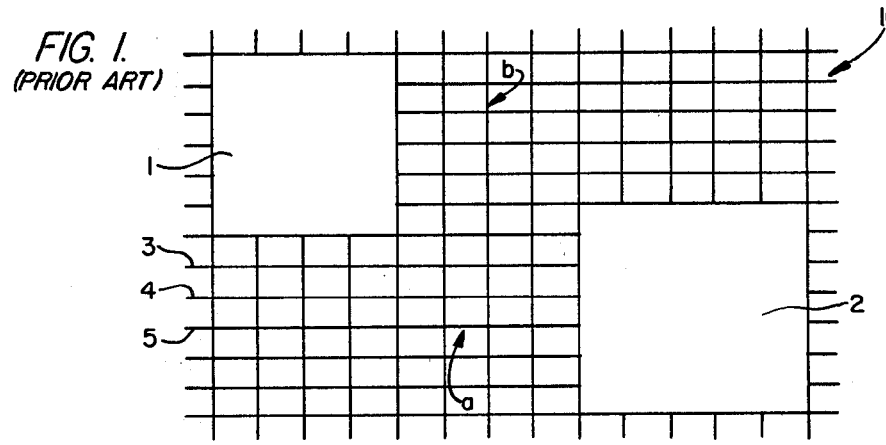
FIG. 1 explains the existing wiring method.

The preferred embodiment of the present invention will be explained by referring to the drawings.

Figure 2:
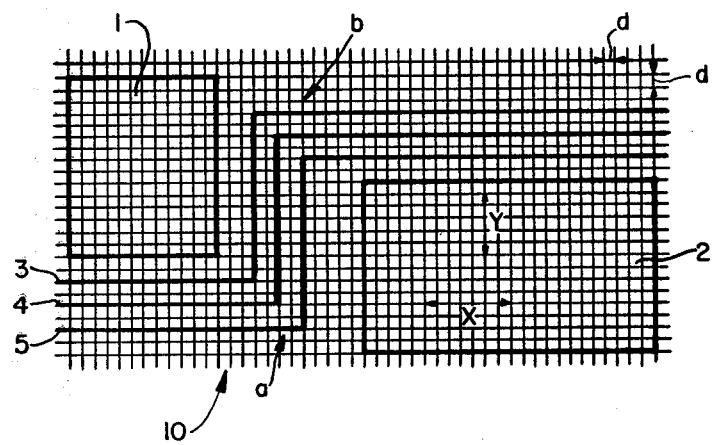
FIG. 2 explains the wiring method of this invention.

FIG. 2 explains a wiring method of the present invention. In FIG. 2, 10 is a grid with the same interval for the vertical lines and horizontal lines, forming square meshes. This vertical and horizontal line interval d should be selected to the greatest common measure 5 $\mu$m when the allowable minimum pitch of the 1st layer wiring is 10 $\mu$m, while that of the 2nd wiring layer is 15 $\mu$m. Thus, the 1st and 2nd layer wirings assuring allowable minimum line interval can be depicted easily by depicting the wiring of the 1st layer on the vertical and horizontal lines in every other line, while depicting the wiring of the 2nd layer on the vertical and horizontal line. In the every two other lines. In case of depicting a wiring which bends at a right angle at the portions a and b (like the wirings 3, 4, 5) the 1st layer wiring pattern can be depicted only by drawing the line on the vertical and horizontal lines in every other line (in actuality, a line having a width must be drawn since the wiring has a certain width, but in this figure the width is omitted for simplification), and there is no need of forming the wiring at the portions a and b of the 2nd layer. Of course, the wirings 3, 4, 5 can be formed as the 2nd layer. In this case, the drawing of wiring patterns for both the vertical and horizontal parts on the vertical and horizontal lines of the grid is required in every two other line. In case there are other wirings between the cells 1 and 2 and the wirings 3, 4, 5 cross said other wirings between the portions a and b, unwanted contact can be avoided by forming the wiring between the portions a and b of the wirings 3, 4, 5 as the 2nd layer (considering that said other wiring between the cells 1 and 2 and the lateral portion of the wirings 3 to 5 exist as the 1st layer). But in this case, only drawing of the part between a and b of the wirings 3 to 5 on the vertical lines in every two lines as shown by the dotted line in FIG. 2 is required.

As explained above, in the grid system for the wiring patterns where the wiring of each layer maintains the allowable minimum line interval, the line interval does not exceed the required interval and thereby the integration density is improved. This can be done only by depicting the wiring patterns according to the rule that the pattern of the 1st layer should be depicted on the vertical and horizontal lines in every other line, while that of the 2nd layer in every two other lines. Of course, it goes without saying that it is also possible to make wiring with an interval larger than that mentioned above under the condition of connection with the cell terminals and other conditions. The check required for the wiring patterns depicted is to find out the use of the adjacent grid or the use of the grid one or two lines apart; breaking the rule that the pattern should be drawn in every other one or two other lines, and the check whether each wiring pitch maintains an interval of 10 $\mu$m or 15 $\mu$m or not which has been carried out in the existing section paper system is no longer required. This actually results in a significant advantage. Namely, in the case of the system shown in FIG. 2, the check of wiring pitch can be done (for the first layer wiring), for example, by storing the horizontal part of each wiring pattern in the memory (1 or 0 for each horizontal line according to the line depicted or not depicted on such horizontal line with the X coordinate considered as an address), storing in the same way the vertical part in the memory and by checking whether the line is depicted in the horizontal part on both sides of each line (including the part slightly preceding the line because the diagonal direction should also be considered), namely checking whether 1 is stored or not (should not be stored in the normal condition). This check can be carried out with comparative easiness. If this check method is also introduced into the section paper system, the check is very complicated because a segment must be stored for each vertical and horizontal line of a minute section (a difference of 5 times is generated for the abovementioned unit of 5 $\mu$m and 10 $\mu$m), and therefore required memory capacity increases (5$\times$5=25 times in the above example), and the interval check should be done for the 1st, 2nd, 3rd, 4th and 5th vertical and horizontal lines in both sides.

Figure 3:
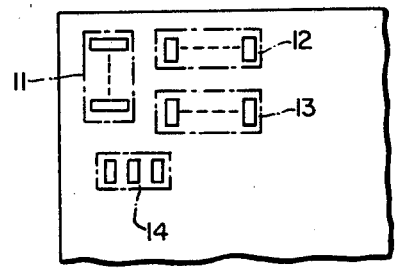
FIG. 3 explains cell layout.

Sometimes, it is more convenient for an integrated circuit to dispose a cell like the cell group 11 in FIG. 3 which is rotated by 90° from the other cell groups 12, 13, . . . from the point of view of connections and use of space. In the case of the present invention utilizing square grids, such a rotation of 90° can be done freely only by selecting the vertical and horizontal dimensions of cell to the integer times of the grid interval, and even when the cell groups are rotated, the cell terminals can easily be matched to the wirings. However, in the case of the existing grid of FIG. 1 where the vertical line interval and horizontal line interval are not equal, if a cell group is rotated by 90 degrees, the sides of the cell do not match the vertical and horizontal lines of the grid and in addition the cell terminals do not match the wirings.

Moreover, in the existing system of FIG. 1, only observation of a rule that the 1st layer wiring should be depicted on the horizontal lines, while the 2nd layer wiring on the vertical lines is required. Thereby, the allowable minimum line interval of each layer can be acquired, and interval check is no longer required, except for the visual check confirming that each wiring pattern should exist only on the vertical and horizontal lines of the grid which is necessary only for ensuring further reliability. But the existing method mentioned above provides such disadvantages that the vertical part and horizontal part of the wiring are separated on the different layers and an attempt to establish the wiring on the same layer in order to prevent such demerit causes a line interval which is larger than the necessary interval.

In short, the section paper system assures high flexibility due to excessive degree of freedom but is not suited for automatic wiring due to complicated programming. On the contrary, the existing grid system is very simple, and is suitable for application of the line search method (the empty vertical and horizontal lines are searched according to the connection command and when an empty line is found, wiring is depicted on it) and a channel router (for example, the necessary vertical line group is depicted along the vertical grid line at the time of connecting between cells 1 and 2, and then terminals of cells 1 and 2 connected in common using the above vertical lines as the bus line are connected by the horizontal lines). However, this method has a disadvantage that degree of freedom in layout is small because the horizontal wirings are carried as the 1st wiring layer and the vertical wirings are made as the 2nd wiring layer. The present invention has succeeded in introducing the advantages of the foregoing systems but eliminating the disadvantages. In other words, the concept of the grid system still maintains a simplified check of wiring and allows high degree of freedom to prevent complication of wirings, reduction of integration density and deterioration of characteristic.

In the present invention, the grid interval is determined on the basis of the minimum wiring pitch of each wiring layer but in case the greatest common measure or factor becomes very small (in this case many vertical and horizontal lines must be depicted between the wiring patterns of each layer), the minimum wiring pitch is selected at a value which is larger than the allowable minimum pitch and convenient for use. For example, in case said allowable minimum pitches are not 10 $\mu$m and 15 $\mu$m, but 10 $\mu$m and 14 $\mu$m, and therefore the greatest common factor is 2 $\mu$m, it is recommended to change the one minimum wiring pitch to 15 $\mu$m from 14 $\mu$m and take adequate measures such as the greatest common measure is selected to 5 $\mu$m. Moreover, in case three or more wiring layers are used, the grid pitch should be determined by the greatest common factor among these layers. In practicality, when the allowable minimum wiring pitch of the 3rd layer in the above example is 17 $\mu$m, wiring can be made using a grid of 5 $\mu$m as the greatest common factor of these three layers. In case more layers are used for wiring, the grid pitch should be selected to the greatest common factor of the allowable minimum line intervals of these layers. In this case also adjustment is necessary so that said pitch is not selected to an excessively small value.

Figure 4:
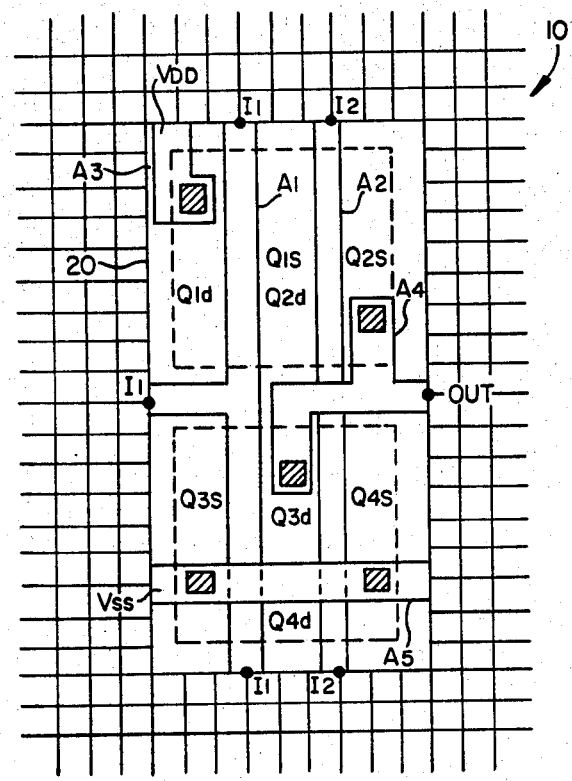
FIG. 4 is a plan view indicating an example of a cell of the present invention.

FIG. 4 shows an embodiment of a cell of a semiconductor integrated circuit generated by said wiring method.

Figure 5:
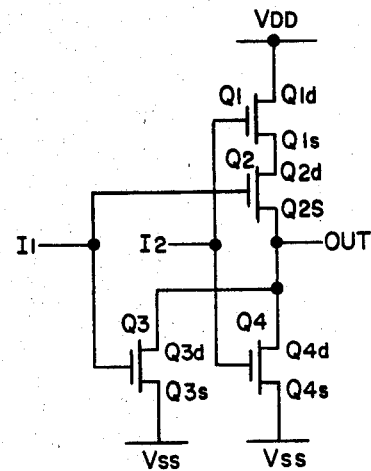
FIG. 5 is an equivalent circuit of the cell shown in FIG. 4.

In this figure, 10 is a grid shown in FIG. 2 having an interval of 5 $\mu$m which is the greatest common factor of the wiring pitches of the 1st and 2nd wiring layers . . . of an integrated circuit, for which the wiring pitch of the 1st layer is 10 $\mu$m and of the 2nd layer is 15 $\mu$m in the preceding example. 20 is a cell similar to cells 1 and 2 of FIG. 1 in the above example. The vertical and horizontal dimensions are selected to be an integer multiple of the interval (5 $\mu$m) of the square mesh grid 10. In this example, this cell 20 is selected to such dimensions as 5×18 $\mu$m in vertical and 5×9$\mu$m in horizontal. This cell 20 is the CMOS NOR gate with two inputs and its equivalent circuit is shown in FIG. 5. Correspondence between the source and drain of the FET's Q1 to Q4 in FIG. 4 and FIG. 5 is indicated by the symbols Q1s, Q1d . . . I$_1$ and I$_2$ are input terminals; OUT is an output terminal; V$_{DD}$, V$_{SS}$ are power sources; A$_1$, A$_2$ are polycrystalline silicon patterns; A$_3$ to A$_5$ are aluminium wiring patterns; and the hatched rectangular areas are contact windows. As shown in this figure, the terminals I$_1$, I$_2$, OUT, V$_{DD}$, V$_{SS}$ of the cell 20 are provided on the area of the grid, allowing wiring (in the above example, the spacing is kept at least at a 10 $\mu$m interval for the 1st layer or 15 $\mu$m interval for the 2nd layer). Thus, even when a cell 20 is rotated 90 degrees, the cell edges match the vertical and horizontal lines of grid, also matching each terminal and wiring. Therefore, rotation of 90 degrees can be done freely and easily without any problems.

Figure 6:
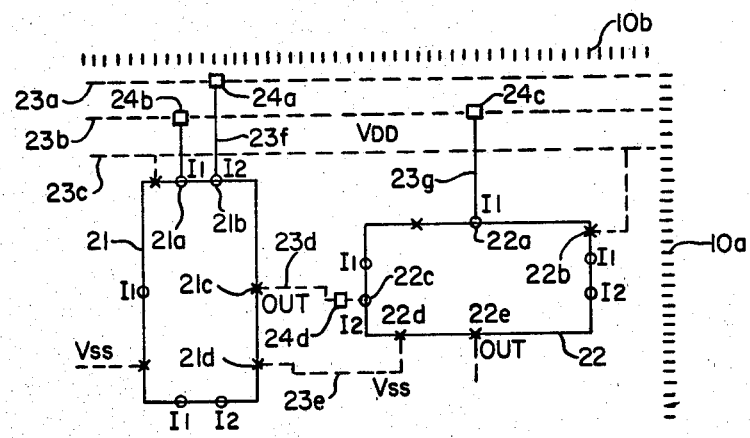
FIG. 6 shows the layout where a couple of cells shown in FIG. 4 are rotated by 90 degrees.

FIG. 6 is an example of a cell disposed by rotation of 90 degrees. In this figure, 21, 22 are cells disposed vertically and horizontally, respectively; 10 a and 10 b are respectively vertical and horizontal intervals of the grid. In this example, the cells 21 and 22 have the same dimensions where the longer side is 18 times of the grid interval, while the shorter side is 9 times of the grid interval. 21 a, 21 b, . . . 22 a, 22 b, . . . are terminals which are arranged with the interval larger than the allowable minimum line interval and being matched with the vertical and horizontal lines of grid. Therefore, they easily and accurately match the wirings 23 a, 23 b, . . . provided by the grid system. 24 a, 24 b . . . are contact windows. The wiring 23 d connected by the contact window 24 d is respectively provided on the 2nd layer in the left side of the figure and 1st layer in the right side.

Here, it is not always required that the wiring in the cell follow the wiring method of the present invention, and wiring may be done at the outside of the grid.

In the wiring of the cells, even if one or several wirings are made not conforming to the wiring method of the present invention in the total wiring area when the majority of the wirings are made conforming to the wiring method of the present invention, such wiring should be covered by the present invention.

As is explained above, according to the present invention, layout can be simplified and automatic wiring becomes possible. In addition, a high degree of freedom in circuit design can be obtained. Thus, advancement of design automation (DA) for layout directly brings about easy manufacture of a large scale integrated circuit having high integration density and performance which can provide the outstanding result of the present invention.

We claim:

1. A semiconductor integrated circuit having a top side of overlapped wiring layers, each layer having a respective minimum wiring pitch, said circuit comprising:

connection wirings formed on respective ones of said overlapped wiring layers, and spaced in accordance with a grid having square meshes with an interval which is larger than a length corresponding to a minimum dimension for patterning in a manufacturing process for making said integrated circuit and corresponding to the respective wiring pitches of the overlapped wiring layers, said respective wiring pitches being expressed by a maximum integer unit which is not a prime number; and circuit cells respectively connected to corresponding ones of said connection wirings, said circuit cells having vertical and horizontal dimensions corresponding to respective integer multiples of said interval, and terminals spaced in accordance with said grid, for connection to corresponding ones of said connection wirings.

2. A semiconductor integrated circuit as claimed in claim 1, wherein the minimum wiring pitch of a first wiring layer is 10 μm, the minimum wiring pitch of a second wiring layer is 14 μm and the greatest common factor is selected to be 5 μm.

3. A semiconductor integrated circuit as claimed in claim 2, wherein the minimum wiring pitch of a third wiring layer is 17 μm and the greatest common factor is 5 μm.

4. A semiconductor integrated circuit as claimed in claim 1, wherein all said horizontal and vertical wirings are respectively disposed on different wiring layers.

5. A semiconductor integrated circuit as claimed in claim 1, wherein said vertical and horizontal wirings are disposed on the same said wiring layer.

6. A semiconductor integrated circuit as claimed in claim 1, wherein each of said circuit cells can be mounted in a first position and in a second position which is rotated 90 degrees from said first position.

7. A method for wiring a semiconductor integrated circuit having a top side of overlapped wiring layers, each layer having a minimum wiring pitch, said method comprising the steps of:

(a) partitioning the top side in the form of a grid with a vertical line group and a horizontal line group, the lines of the vertical and horizontal line groups having an interval larger than a length corresponding to a minimum dimension for patterning in a manufacturing process;

(b) positioning circuit cells of the integrated circuit in accordance with the grid, each cell having dimensions corresponding to respective integer multiples of the interval;

(c) forming wiring patterns for connection between the cells spaced in accordance with the vertical and horizontal lines, the vertical and horizontal wiring patterns being formed on the same or a different overlapped wiring layer in accordance with the vertical and horizontal lines having the interval, the interval of the vertical and horizontal lines of the grid being selected to be a dimension corresponding to the greatest common factor of the respective minimum wiring pitches of the overlapped wiring layers, the respective minimum wiring pitches being expressed by a maximum integer unit not a prime number.

8. A wiring method as claimed in claim 7, wherein in step (a), the interval corresponds to a value of ½ of the minimum wiring pitch of a first wiring layer being equal to ⅓ of the minimum wiring pitch of a second wiring layer; and wherein step (c) further includes forming the first wiring layer in accordance with the vertical and horizontal lines, using only every other line, and forming the second wiring layer in accordance with the vertical and horizontal lines, using every other two lines.

9. A wiring method as claimed in claim 7 or 8, wherein the minimum wiring pitch of a first wiring layer is 10 μm, the minimum wiring pitch of a second wiring layer is 14 μm and the greatest common factor is selected to be 5 μm.

10. A wiring method as claimed in claim 9, wherein the minimum wiring pitch of a third wiring layer is 17 μm and the greatest common factor is 5 μm.

11. A wiring method as claimed in claim 7, wherein said horizontal and vertical wiring patterns are respectively disposed on different wiring layers.

12. A wiring method as claimed in claim 7, wherein said vertical and horizontal wiring patterns are disposed on the same said wiring layer.

13. A wiring method as claimed in claim 7 or 8, wherein each of said circuit cells can be mounted in a first position and in a second position which is rotated 90 degrees from said first position.

* * * * *

UNITED STATES PATENT AND TRADEMARK OFFICE
CERTIFICATE OF CORRECTION

PATENT NO. : 4,412,240
DATED : October 25, 1983
INVENTOR(S) : KIKUCHI ET AL.

It is certified that error appears in the above-identified patent and that said Letters Patent is hereby corrected as shown below:

Front page, [57] ABSTRACT, line 13, after "to" insert --be--;
          line 14, "said" should be --the--;
          line 19, "in an" should be --on--.
Column 1, line 16, change "where" to --by which--;
          line 25, change "dimensions" to --dimension--;
          line 50, delete "were".
Column 2, line 5, after "In" insert --a--.
Column 3, line 64, change "line. In the" to --lines in--;
          change "lines. In" to --line. In the--.

Signed and Sealed this

Twenty-fifth Day of December 1984

[SEAL]

Attest:

GERALD J. MOSSINGHOFF

*Attesting Officer*     *Commissioner of Patents and Trademarks*